United States Patent
Augustine et al.

(10) Patent No.: US 9,514,796 B1
(45) Date of Patent: Dec. 6, 2016

(54) MAGNETIC STORAGE CELL MEMORY WITH BACK HOP-PREVENTION

(71) Applicant: Intel Corporation, Santa Clara, CA (US)

(72) Inventors: Charles Augustine, Hillsboro, OR (US); Shigeki Tomishima, Portland, OR (US); Wei Wu, Portland, OR (US); Shih-Lien Lu, Portland, OR (US); James W. Tschanz, Portland, OR (US); Georgios Panagopoulos, Munich (DE); Helia Naeimi, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/751,801

(22) Filed: Jun. 26, 2015

(51) Int. Cl.
G11C 11/00 (2006.01)
G11C 11/14 (2006.01)
G11C 11/15 (2006.01)
G11C 11/16 (2006.01)

(52) U.S. Cl.
CPC ........ G11C 11/1675 (2013.01); G11C 11/1693 (2013.01)

(58) Field of Classification Search
USPC ................ 365/148, 158, 163, 171, 173, 175
See application file for complete search history.

(56) References Cited

U.S. PATENT DOCUMENTS

| | | | |
|---|---|---|---|
| 7,382,664 B2 * | 6/2008 | Le Phan | G11C 7/22 365/158 |
| 7,795,696 B2 * | 9/2010 | Mryasov | G11C 11/16 365/171 |
| 8,842,467 B2 * | 9/2014 | Oh | G11C 11/1675 365/158 |
| 8,964,458 B2 * | 2/2015 | Lin | G11C 11/161 365/148 |
| 2006/0002180 A1 | 1/2006 | Frey | |
| 2010/0103726 A1 | 4/2010 | Bae et al. | |
| 2012/0327707 A1 | 12/2012 | Ahn et al. | |
| 2013/0235677 A1 | 9/2013 | Park | |
| 2014/0204650 A1 | 7/2014 | Lee et al. | |

OTHER PUBLICATIONS

Min, T., "BACL-Hopping After Spin Torque Transfer Induced Magnetization Switching in Magnetic Tunneling Junction Cells", Journal of Applied Physics, vol. 105, Issue 7, pp. 07D126-07D126-3, Mar. 12, 2009.
International Search Report and Written Opinion in related PCT/2016/031895 application, mailed Aug. 29, 2016, 11 pages.

* cited by examiner

*Primary Examiner* — Trong Phan
(74) *Attorney, Agent, or Firm* — Blakely, Sokoloff, Taylor & Zafman LLP

(57) ABSTRACT

An apparatus is described that includes a semiconductor chip memory array having resistive storage cells. The apparatus also includes a comparator to compare a first word to be written into the array against a second word stored in the array at the location targeted by a write operation that will write the first word into the array. The apparatus also includes circuitry to iteratively write to one or more bit locations where a difference exists between the first word and the second word with increasing write current intensity with each successive iteration.

20 Claims, 10 Drawing Sheets

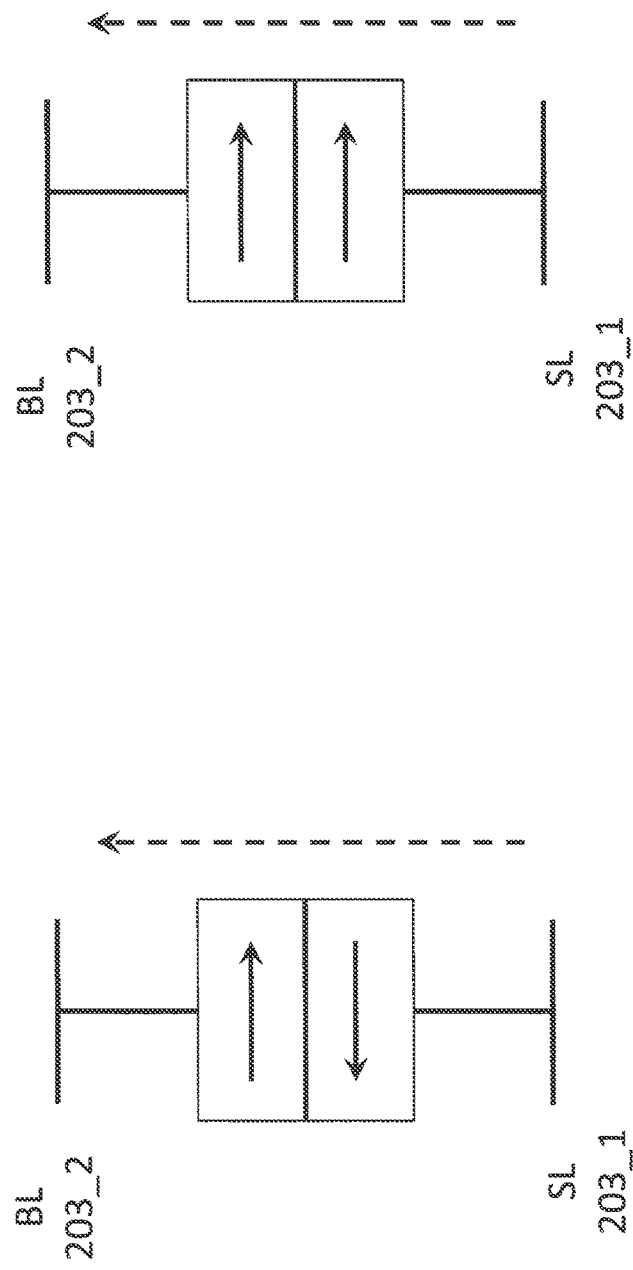

Fig. 2c(iii)

Fig. 2c(ii)

MAGNETIC STORAGE CELL MEMORY WITH BACK HOP-PREVENTION

FIELD OF INVENTION

The field of invention pertains generally to the semiconductor arts, and, more specifically, to a magnetic storage cell memory with back-hop prevention.

BACKGROUND

FIG. 1 (Prior Art) shows a diagram of an architecture 100 for a random access memory implemented on a semiconductor chip. As observed in FIG. 1, the memory architecture includes a "slice" of multiple storage cells 102 each of which store a bit of information for a particular bit line amongst a plurality of bit lines 103. The memory includes a number (N) of such slices 101 equal to the bit width of the words that are read/written from/to the memory. During a read or write operation one, same positioned storage cell in each slice is activated. In the case of a read the activated storage cell provides a bit of information on its corresponding bit line. In the case of a write the activated storage cell receives a bit of information on its corresponding bit line.

Which particular same positioned storage cell is to be activated in each of the slices 101 by any particular memory access is determined by the address decoder 104. Here, the address decoder 104 receives an incoming address 105 and, in response, activates one of the wordlines wl_0 to wl_M−1. As each wordline is coupled to a same positioned storage cell across all of the slices 101, the activation of one wordline in response to an address effectively enables one storage cell for each bit of the incoming/outgoing data word. A single memory chip may include just one or multiple instances of the architecture 100 observed in FIG. 1 (Prior Art). In the case of the later, the process of address decoding may include activating and/or deactivating whole sections of the memory that conform to the architecture of FIG. 1 (Prior Art).

FIGURES

A better understanding of the present invention can be obtained from the following detailed description in conjunction with the following drawings, in which.

Figure 2A:
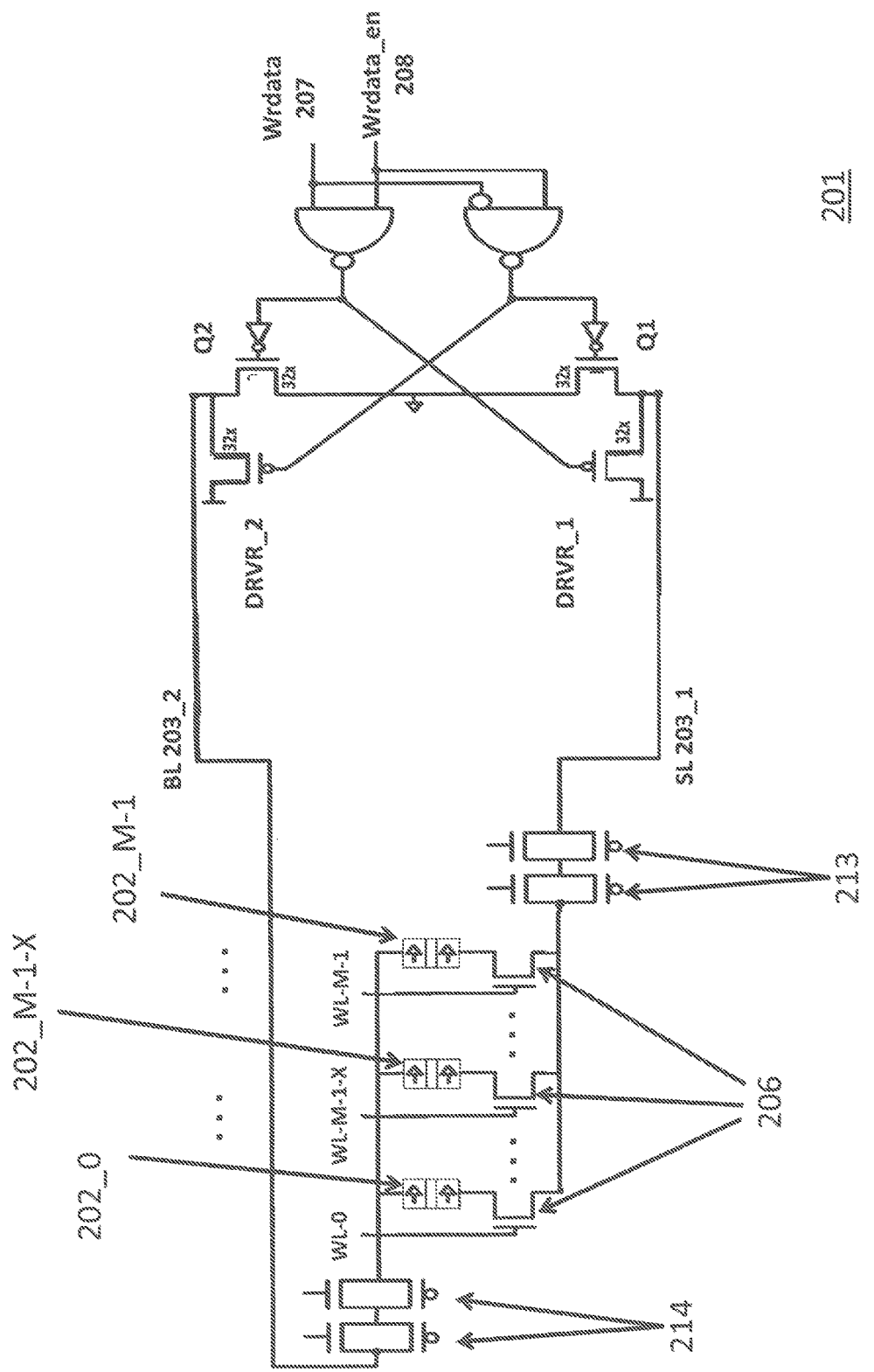
FIG. 2a shows an embodiment of a memory slice's write circuitry.
Figure 2C:
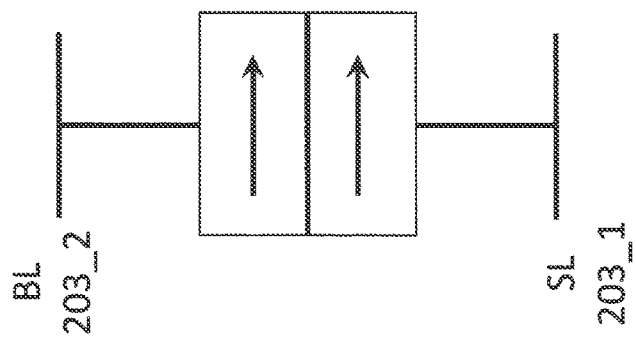
Figure 2C:
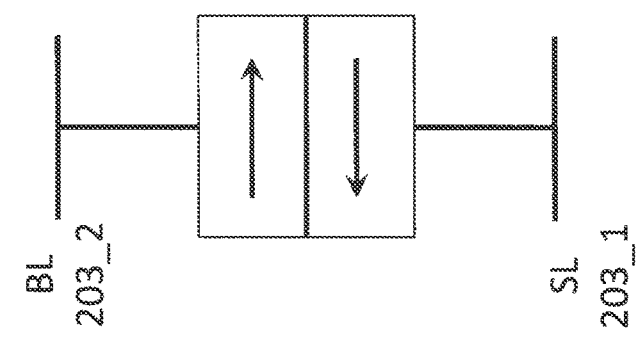
Figure 2C:
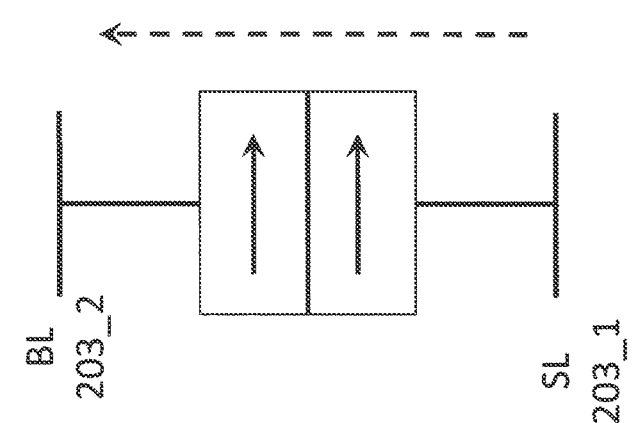
Figure 3:
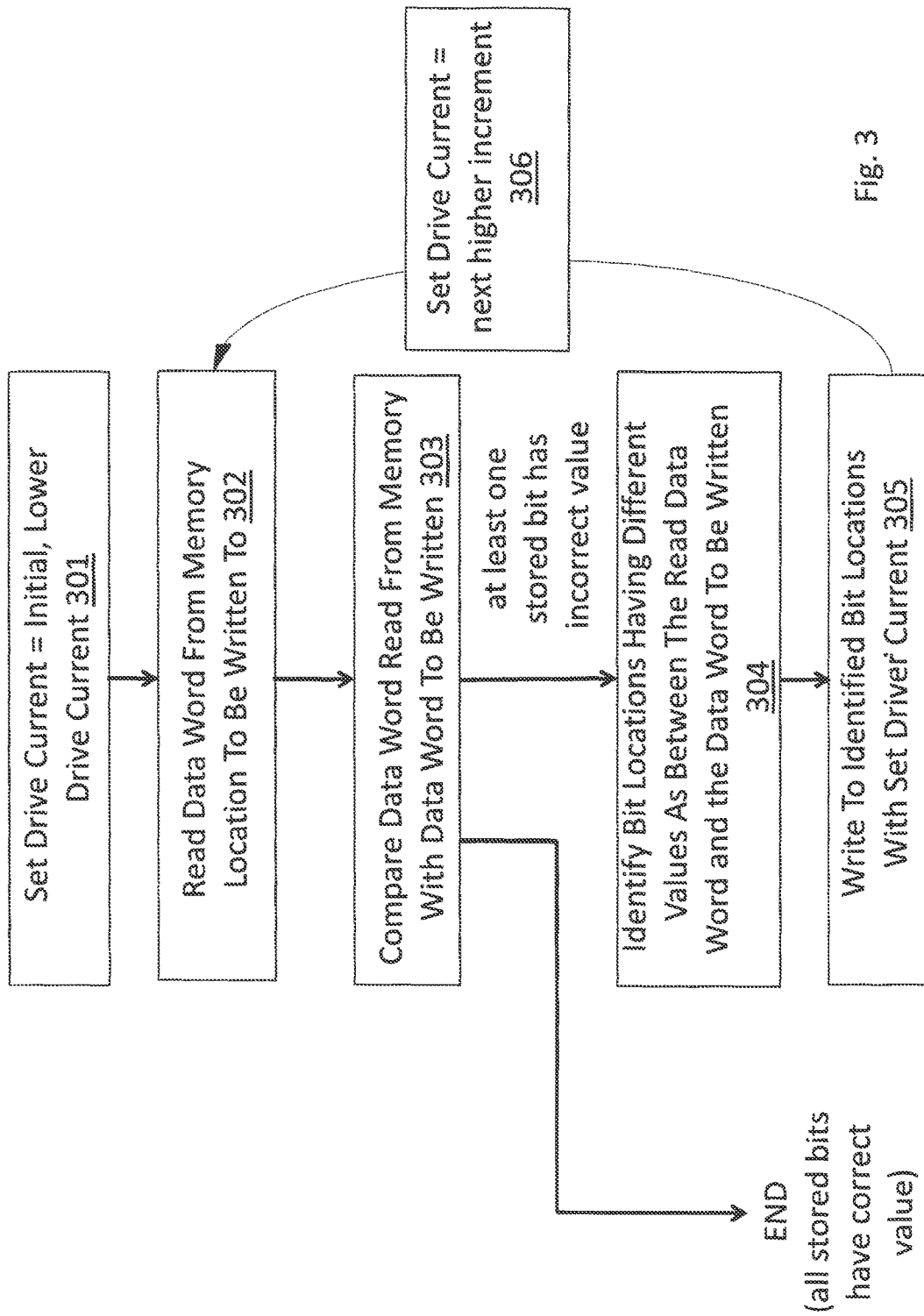
Figure 4:
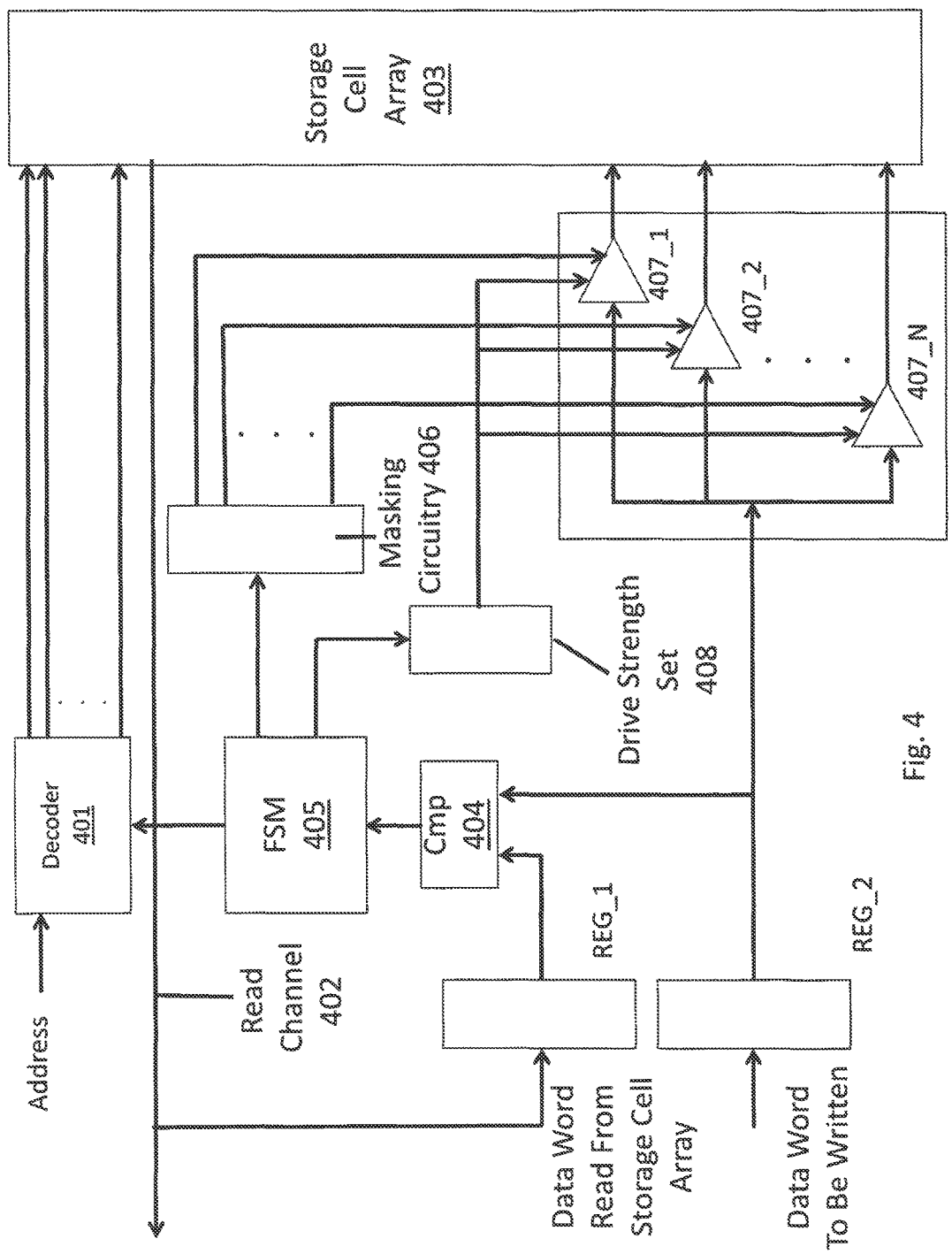

FIGS. 2b(i) and 2b(ii) show a first back-hop mechanism;

FIGS. 2c(i), 2c(ii) and 2c(iii) show a second back-hop mechanism;

FIG. 3 shows a memory write process;

FIG. 4 shows a first embodiment of a circuit that can perform the write process of FIG. 3

Figure 5:
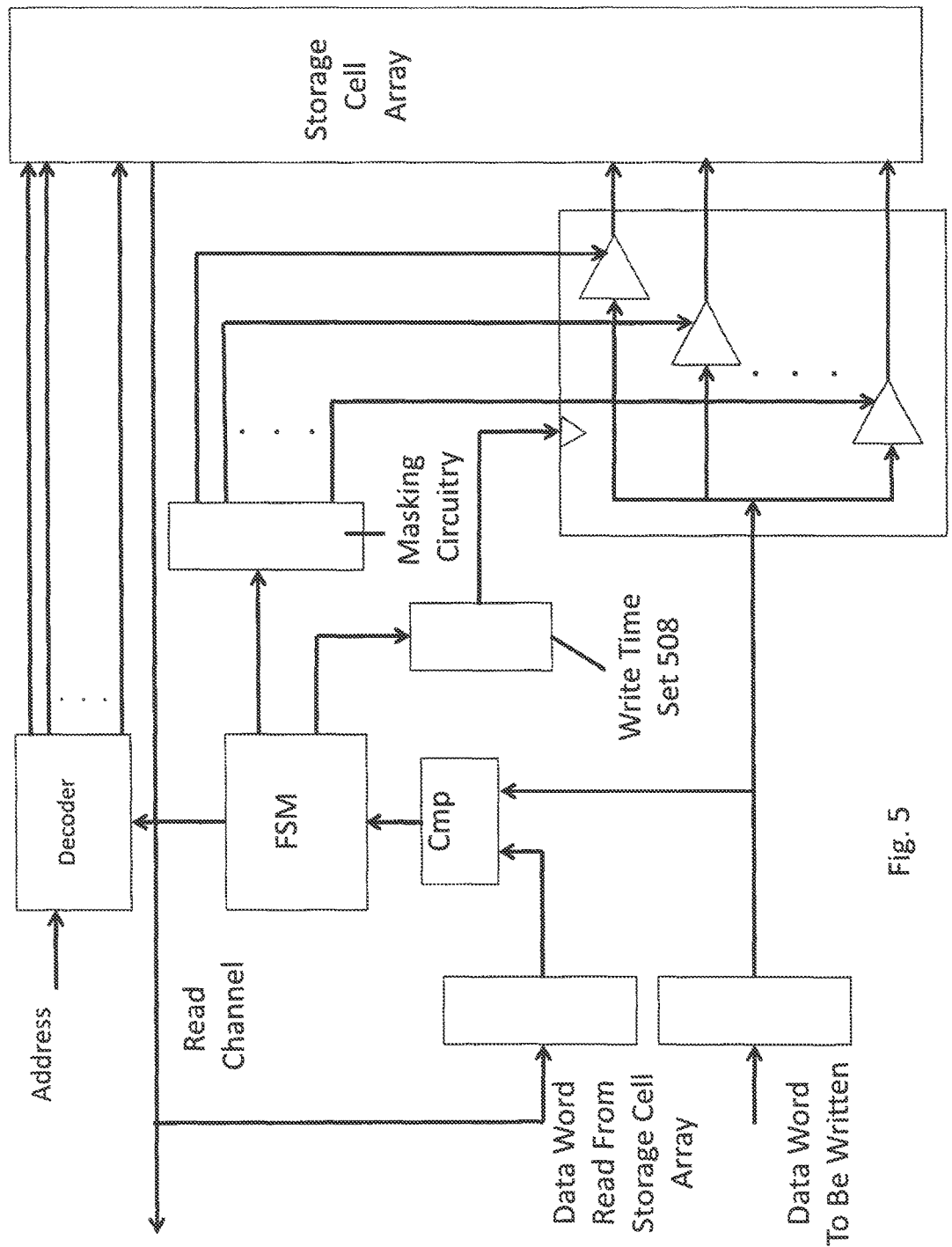
Figure 6:
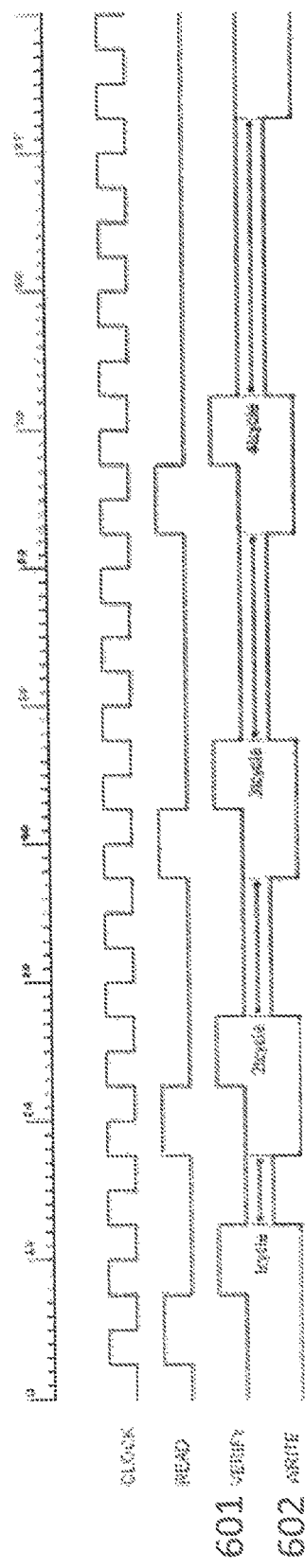
Figure 7:
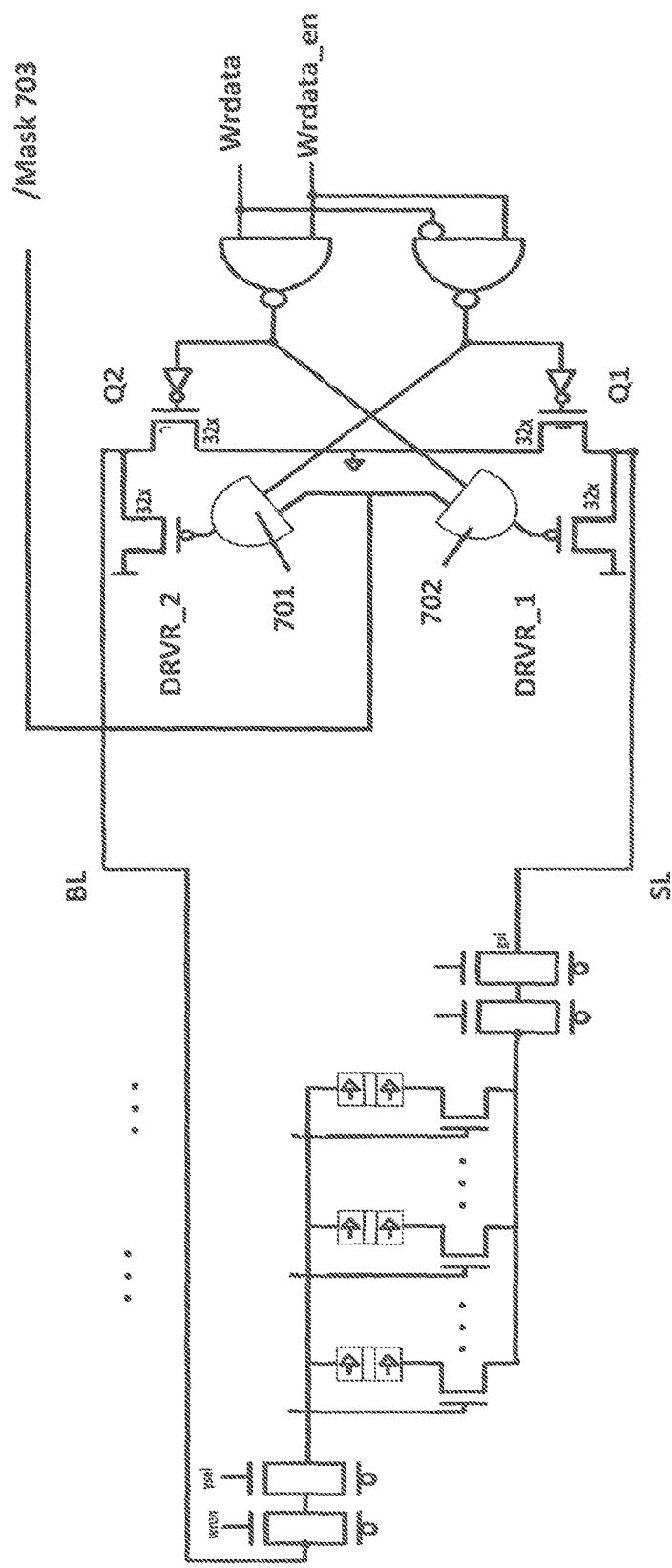
Figure 8:
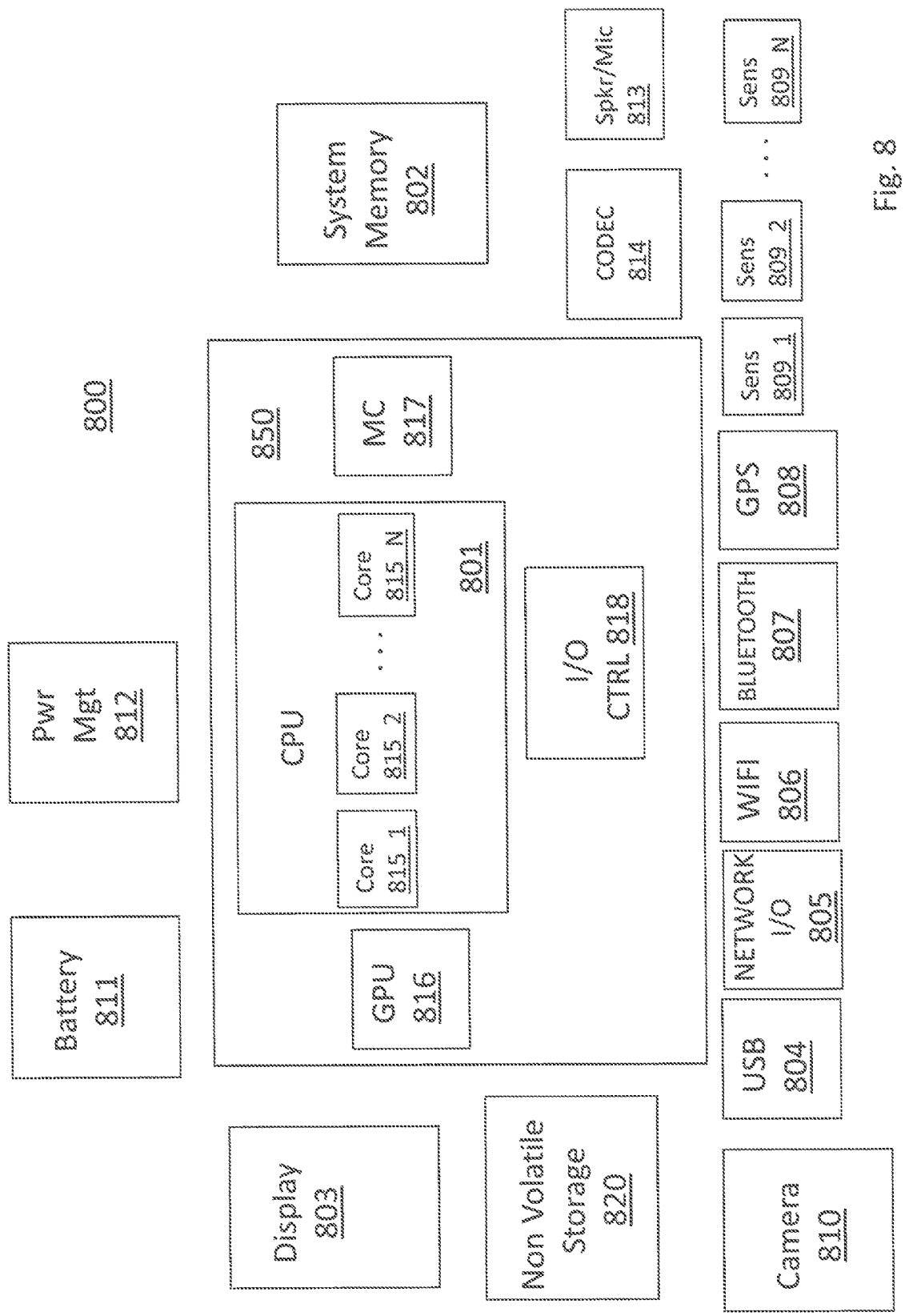

FIG. 5 shows a second embodiment of a circuit that can perform the write process of FIG. 3;

FIG. 6 shows a timing diagram of a memory write process performed according to the write process of FIG. 3;

FIG. 7 shows an improved memory slice write circuit;

FIG. 8 shows a computer system.

DETAILED DESCRIPTION

FIG. 2a shows an embodiment of a design for a slice whose storage cells include non volatile storage cells such as spin-transfer torque magnetic random access memory (STT-MRAM) cells or magnetic tunnel junction (MTJ) random access memory cells. As is known in the art, a magnetic storage cell stores a bit of information based on magnetization directions that are held within the storage cell (e.g., a pair of anti-parallel magnetization directions correspond to a 1, or, a pair of parallel magnetization directions correspond to a 0). In a common approach, the resistance of the cell changes as a function of its internal magnetization directions. Thus whether a storage cell is holding a 1 or a 0 can be determined by applying a voltage across the cell and sensing the amount of current that flows through the cell (or driving a current through the cell and sensing the voltage across the cell).

The embodiment of FIG. 2a shows the write circuitry for a memory slice (that is, for simplicity, the data read sense circuitry is not shown). As observed in FIG. 2a, the slice includes M storage cells 202_0 . . . 202 M−1−X . . . 202_M−1 respective coupled to word lines WL 0 . . . WL M−1−X . . . WL M−1. The bitline is differential in that there exists a pair of bitlines 203_1 (SL), 203_2 (BL) that carry data values of opposite polarity. As will be clear from the description below, whether a "1" or a "0" is written into a storage cell depends on the direction of a current that is driven through the storage cell.

In the case where a 1 is to be written into a particular storage cell, initially, the word line (WL) for that storage cell is activated which turns on the storage cell's corresponding access transistor 206. The wordlines of the other storage cells are not activated which keeps their corresponding access transistor off. Both sets of pass gates 213, 214 are also enabled. A voltage level corresponding to a "1" is then applied to the Wrdata input 207 and the Wrdata_en enable line 208 is activated. In response, the DRVR_1 and Q2 transistors are on and the DRVR_2 and Q1 transistors are off, which in turn, presents a "1" voltage level on the Wrdata or "SL" bitline 203_1 and a "0" voltage level on the /Wrdata or "BL" bitline 203_2. From these voltage settings a current is driving "up" vertically (as observed in FIG. 2a) through the storage cell.

By contrast, in the case where a 0 is to be written into a particular storage cell, initially, the word line for that storage cell is activated which turns on the storage cell's corresponding access transistor. A voltage level corresponding to a "0" is then applied to the Wrdata input 207 and the Wrdata enable line 208 is activated. In response, the DRVR_2 and Q1 transistors are on and the DRVR_1 and Q2 transistors are off, which in turn, presents a "1" voltage level on the BL bitline 203_2 and a "0" voltage level on the SL bitline 203_1. From these voltage settings a current is driven "down" vertically (as observed in FIG. 2a) through the storage cell.

A problem with the operation of the slice of FIG. 2a is a phenomena known as "back-hop" in which a storage cell will keep a data value that is opposite to the data value that was intended to be written into the storage cell. Two different types of back-hop are known. Both types are discussed in succession with respect to FIGS. 2b and 2c immediately below.

FIG. 2b shows a first type of back-hop problem where same data is overwritten, yet the storage cell keeps the opposite value. As observed in FIG. 2b(i) a "1" is being written into a storage cell that is already storing a "1" (its internal magnetization directions are anti-parallel). However, in the case of extensive overwrite activity, as observed in FIG. 2b(ii), the magnetization directions within the storage cell undesirably "flip" into a parallel state rather than hold an anti-parallel state. As such, the storage cell keeps a "0" rather than the intended data value, "1". The opposite error can occur in the case where a "0" is overwritten into a cell that is already keeping a "0" with parallel magnetization directions.

FIG. 2c shows a second type of back-hop problem where a change in data is intended but the storage cell keeps its original value. As observed in FIG. 2c(i) the storage cell is holding a "0" with internal parallel magnetizations and a "1" is being written into the storage cell with a current that is driven from the SL bitline to the BL bitline. As observed in FIG. 2c(ii), the storage cell immediately responds and flips to an anti-parallel "1" state. Again however, if the write activity is too strong, by being applied for too long of a time period and/or with too strong of a current amplitude, the storage cell can "flip-back" to its original state as observed in FIG. 2c(iii) where the original parallel "0" is observed within the storage cell. A corresponding event can occur in the case where a "0" is written with too much emphasis when the storage cell is holding a "1".

Note that in both FIGS. 2b and 2c, a "fixed" magnetic direction layer is tied to the BL side and points to the right. In various other embodiments, the "fixed" magnetic direction layer may be tied to the SL side and/or point to the left.

It is worthwhile mentioning that different storage cells will exhibit back-hop under different circumstances as a consequence of manufacturing tolerances. That is, there is some spread or distribution of the various features and characteristics of the many storage cells that are manufactured into a same memory. As a consequence, whereas a first storage cell may exhibit back-hop with a particular amount of drive current and/or applied drive current time, another storage cell within the same memory may not exhibit back-hop. Further still, the amount of drive current needed to properly write a value into a cell (in terms of current amplitude and/or amount of time applied) may also vary from cell to cell. For example, a weaker drive current may be enough to "flip" a first storage cell from a first value to a second value, but may not be enough to "flip" a second storage cell from the first value to the second value.

Figure 1:
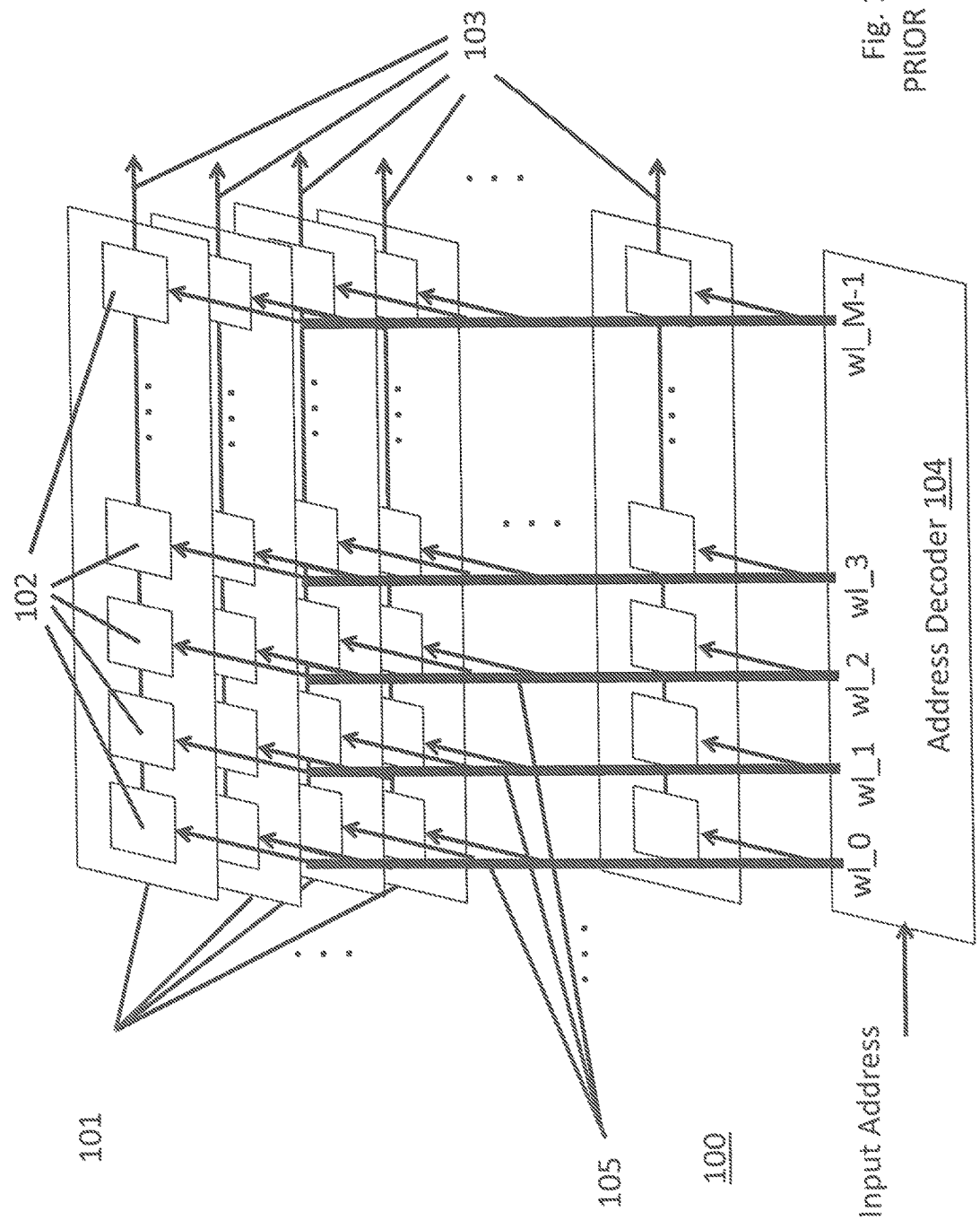
FIG. 1 shows a memory circuit architecture.

FIG. 3 shows a write methodology that aims to avoid both of the back-hop mechanisms discussed above with respect to FIGS. 2b and 2c. Recall from the discussion of FIG. 1 that a particular (e.g., same positioned) storage cell within each slice is written to when a word is written into the memory. The discussion above with respect to FIGS. 2b and 2c indicated that back-hop can arise when same data is being overwritten into a storage cell or when different data is being written into a storage cell. Thus, in the case of a nominal memory write, each storage cell has the propensity to exhibit back-hop irrespective of the word that is resident in the implicated cells and the word that will be written over these same cells. The methodology of FIG. 3 seeks to eliminate the potential of both types of back-hop from the writing process.

Referring to the methodology of FIG. 3, initially the write current is set to some minimal value 301. Here, the minimal write current can be established by minimizing the write current amplitude and/or minimizing the write current time. According to one embodiment, the minimal write current is set to a level that, e.g., according to a statistical analysis from numerous storage cells, should set some approximate percentage of storage cells (e.g., 50% of storage cells should be set, 75% of storage cells should be set, etc.). After the write current is set to a minimal value, the data word that exists within the memory location targeted by the pending write address is read from the memory 302.

The data word read from the memory is then bitwise compared against the data word that is to be written into the memory 303. Those bit locations having different data as between the value currently present in memory and the value to be written into memory are flagged as the set of bits to be specifically written to by the current write process 304. As such, no attempt is made to overwrite bits having a same value as between the data that currently exists within the corresponding storage cell and the data that is to be written. Failing to write to these bits corresponds to the correct data remaining in these cells (the data does not change with the new word), and, importantly, the first type of back-hop mechanism discussed above with respect to FIG. 2b is avoided (that is, back-hop from overwriting same data is removed as a possibility).

With the storage cells whose data is to change being flagged, a first write attempt is made only to these cells with the initial, weakest write current 305. The write current is then incremented 306 to a next higher value (e.g., in terms of current amplitude and/or applied drive current time) and the word is again read from memory 302 and bitwise compared against the word being written 303. Ideally, all of the storage cells that were just written to 305 were correctly written and the word just read from memory matches the word being written.

However, owing to the manufacturing tolerances described just above, it is altogether possible that one or more of the cells that were specifically written to did not record the correct data because the weaker write current was too weak. Here, for example, if the initial write current is set to a value that should only correctly set 50% of the cells, then the expectation is that half of the cells that were just written to will still be holding incorrect data.

As such, the comparison 303 of the second iteration may still yield bit locations that are not keeping the correct data value. These remaining bit locations that are still holding incorrect data are again flagged 304 and written to with the next higher incremented write current 305. Here, note that cells that were written to during the first iteration but who are now confirmed as holding correct data from the comparison of the second iteration 303 are not included in the set of cells who are written to a second time. Thus, with each iteration, ideally more and more cells are holding correct data which corresponds to fewer and fewer cells that need to be written to.

In an embodiment, the next higher incremented current is set to some value that, e.g., again from statistical analysis, should set some higher percentage of cells. For example, if the initial lowest current of the first iteration was set to a value that should set 50% of the cells, the next increment write current for the second iteration could be sufficient to set 75% of the cells.

Again, cells that were properly written to by the previous iteration (the comparison of the second iteration revealed that they are now holding correct data) are not written to during the second iteration. By removing such cells from the set of cells that are written to for the next actual write action, the back-hop mechanism associated with a non changing a data value as discussed above with respect to FIG. 2b is removed as a possibility. The write sequence progresses forward with increasing write current strength to set the cells according to the amount of drive strength needed to set them but, also, squelching any further write action to them after they are correctly set so they do not exhibit the back-hop mechanism of FIG. 2b.

The process of FIG. 3 then continues to iterate with each iteration applying greater drive current to progressively fewer storage cells until comparison 302 reveals that the word stored in memory is the correct word. After confirmation that the correct word has been written into memory the write process is complete.

FIG. 4 shows a first embodiment of a circuit that can perform the write process of FIG. 3. Apart from specific write circuitry as described in more detail below, the circuitry of FIG. 4 also includes the nominal address decoder 401 for both reads and writes as well as the nominal read channel 402 for the memory. Thus, during a nominal read, an address is applied to decoder 401 and the data word that is read from storage cell array 403 is provided along read channel 402. Note that the storage cell array 403 may be a three dimensional cross point array.

When a write command is presented to the circuit of FIG. 4, the write address is presented to decoder 401 and the data word stored in the storage cell array 403 at the location targeted by the write address is read from the array 403 and presented along read channel 402. The read data word is then provided to a comparator 404 (to register REG_1) where it is bitwise compared against the data word to be written (provided through register REG_2). The results of the comparison are provided to a finite state machine circuit 405.

The finite state machine circuit 405 determines which bit locations will have their data value changed as a consequence of the write operation and proceeds to only enable the current drive circuits for those bits through masking circuit 406. Here masking circuit 406 provides an individual enable/disable signal to each current driver for each bit cell slice 407_1 through 407_N. That is, for example, current driver 407_1 sources a first slice with a first write current, current driver 407_2 sources a second slice with a second write current, etc.

Masking circuit 406 enables only those current drivers whose corresponding slice contains a storage cell whose data value is to be changed with the next write sequence. Referring briefly back to FIG. 2a, if each slice is implemented with circuitry similar to the circuitry observed in FIG. 2a, then each slice receives its own unique Wrdata_en signal 208 that the masking circuit 406 individually controls in order to enable/disable the writing to a specific bit location in a word.

The finite state machine circuit 405 also controls the amount of write current to apply. In the particular circuit of FIG. 4, write current magnitude is increased by increasing current amplitude. As such, the finite state machine circuit informs a drive strength set circuit 408 of the correct current amplitude for the next write sequence. In response, the drive strength set circuit 408 broadcasts a signal to all current drivers 407 that corresponds to the correct current amplitude.

Those of the drivers that are enabled by the masking circuit 406 will then proceed to drive their corresponding bit lines with the indicated amount of current. Again for the first iteration, a weakest current will be driven. Referring briefly again back to FIG. 2a, note that both the BL and SL bits lines are driven by their own respective driver. That is, the SL bit line 203_1 is driven by DRVR_1 and Q1 and the BL bit line 203_2 is driven by DRVR_2 and Q2. Each of the drivers can be viewed as a 32X PMOS pull-up transistor coupled in series with a 32X NMOS pull-down transistor. The nomenclature "32X" is indicative of the size of the transistor which, in turn, is indicative of the amount of current the transistor can source or sink.

In order to effect different drive current strengths consistent with the teachings of the instant application, according to one embodiment, each 32X transistor observed in FIG. 2a is instead replaced with a plurality of smaller transistors. For example, each 32X transistor may be replaced with four 8X transistors. Each of the four transistors are able to be turned on individually by the drive strength set circuit 408 and the increase in drive strength is effected by turning on one more transistor as compared to the previous iteration. For example, the initial weakest current for the first iteration is established by turning on only one of the 8X transistors, then, the next increment in drive strength for the second iteration is accomplished by turning on two of the 8X transistors, etc. Further granularity and/or configurable dynamic range may be achieved with a plurality of transistors having different drive strengths, e.g., a combination of four transistors of sizes 4x, 4x, 8x and 16x.

Continuing then with a discussion of the overall circuit, after the initial write sequence, the address decoder and read channel circuitry are again used to read the data word from the location targeted by the write address. The data word read from memory is then applied to the comparator 404 and the process repeats. If any new bit locations are keeping the correct data, the finite state machine 405 will present a new data value to the masking circuit that represents the set of bit locations that are currently not keeping the correct data value. Only the drivers for these bit locations will be enabled for the next write sequence. The finite state machine also informs the drive strength circuit 408 of the next higher current amplitude. Thus for the next write sequence, only those bit locations that are currently keeping an incorrect value will be written to with the stepped up current amplitude.

Eventually, e.g., after a number of iterations, the array will keep the correct word in its entirety. On the following read sequence immediately after the write sequence that correctly set the last bit(s) holding incorrect data, the finite state machine will detect that the array is currently holding the correct value and will end the write operation.

FIG. 5 shows another embodiment where, instead of current amplitude, write duration (e.g., in terms of number of clock cycles) is used to implement stronger write currents. For example, with each next iteration, the write current is applied for an extra clock cycle as compared to the previous iteration. Thus, FIG. 5 shows a write time set circuit 508 which may be implemented as a counter (for simplicity the clock signal line is not shown).

The write time set circuit 508 is informed of the correct number of clock cycles to count for the next iteration by the finite state machine. During the write sequence the write time set circuit sends a signal to the drivers to begin driving current (those drivers that are disabled by the masking circuit will ignore this signal) and begins counting clock cycles. When the proper number of clock cycles have transpired the write time set circuit 508 will disable the signal to the drivers thereby turning them off. Referring again to FIG. 2a, the turning on/off of the drivers consistent with the clock cycle count can be effected with a logic gate that enables the Wrdata_en signal 208 for each slice during the active count and disables the Wrdata_en signal 208 upon expiration of the count. As such, note that the write time set circuit 508 can be coupled directly to the masking circuitry to achieve this effect.

FIG. 6 shows an exemplary timing diagram for the circuit of FIG. 5 that includes clock, read, verify 601 and write 602 signals. Here, the verify phase 601 corresponds to the time period in which a data word is read from the array and compared against the data word being written and the time consumed by the finite state machine circuit to setup the masking and current time set circuits. The write phase 602 corresponds to the time period when write current is actually applied to storage cells that were holding incorrect data as of the just concluded verify phase. Note that, in the particular example of FIG. 6, the write phase increases by one clock cycle with each next iteration. In other embodiments the time increase for any next write phase may be more than one clock cycle (and may be a different number additional clock cycles across different write phases).

In various embodiments the embodiments of FIGS. 4 and 5 can be combined to produce a circuit where the finite state machine can set either or both drive current and write time.

In both of FIGS. 4 and 5 the individual current drivers (e.g., current drivers 407_1, 407_2, . . . of FIG. 4, etc.) can be designed to not apply current to their respective cell (because their respective cell is currently recognized as holding correct data) by applying a same or substantially same voltage on both the SL and BL lines of the cell. Here, by biasing both the SL and BL lines with the same voltage, little/no current will flow through the magnetic storage region. FIG. 7 shows an embodiment of a circuit having a first inserted AND gate 701 to directly drive the gate node of DRVR_1 and a second inserted AND gate 702 to directly drive the gate node of DRVR_2. The signal paths leading to both gate nodes are unchanged with respect to FIG. 2a, other than the modification that these signal paths flow through the inserted AND gates 701, 702, e.g., into a first respective input of each AND gate 701, 702. The second respective input of both AND gates are tied together and are nominally set at a logic 1 so the circuit operates no differently than the circuit of FIG. 2a. If the storage cell is deemed not be written to, however, the masking circuitry sets the second respective input of each AND gate to a logic 0 (via the/mask input 703) to turn on both DRVR_1 and DRVR_2 and set both SL and BL to the power rail voltage. Other embodiments may choose to alternatively clamp both the SL and BL lines to a return voltage (e.g., by adding a clamping transistors to ground on both the SL and BL lines).

The memory as described herein may be used in a computing system to implement, e.g., any of a cache, system memory, non volatile deeper storage, BIOS non volatile storage, etc.

Although the embodiments above pertained to a memory having magnetic storage cells, note that the above teachings may apply to other resistive memory technologies (e.g., phase change memories) or any other memory technology where there exists a manufacturing distribution in which a fixed write current may properly set some storage cells but improperly set others.

FIG. 8 shows a depiction of an exemplary computing system 800 such as a personal computing system (e.g., desktop or laptop) or a mobile or handheld computing system such as a tablet device or smartphone. As observed in FIG. 8, the basic computing system may include a central processing unit 801 (which may include, e.g., a plurality of general purpose processing cores and a main memory controller disposed on an applications processor or multi-core processor), system memory 802, a display 803 (e.g., touchscreen, flat-panel), a local wired point-to-point link (e.g., USB) interface 804, various network I/O functions 805 (such as an Ethernet interface and/or cellular modem subsystem), a wireless local area network (e.g., WiFi) interface 806, a wireless point-to-point link (e.g., Bluetooth) interface 807 and a Global Positioning System interface 808, various sensors 809_1 through 809_N (e.g., one or more of a gyroscope, an accelerometer, a magnetometer, a temperature sensor, a pressure sensor, a humidity sensor, etc.), a camera 810, a battery 811, a power management control unit 812, a speaker and microphone 813, an audio coder/decoder 814 and a non volatile storage 820.

An applications processor or multi-core processor 850 may include one or more general purpose processing cores 815_1 to 815_N within its CPU 801, one or more graphical processing units 816, a memory management function 817 (e.g., a memory controller) and an I/O control function 818. The general purpose processing cores 815 typically execute the operating system and application software of the computing system. The graphics processing units 816 typically execute graphics intensive functions to, e.g., generate graphics information that is presented on the display 803. The memory control function 817 interfaces with the system memory 802. The power management control unit 812 generally controls the power consumption of the system 800.

Each of the touchscreen display 803, the communication interfaces 804-807, the GPS interface 808, the sensors 809, the camera 810, and the speaker/microphone codec 813, 814 all can be viewed as various forms of I/O (input and/or output) relative to the overall computing system including, where appropriate, an integrated peripheral device as well (e.g., the camera 810). Depending on implementation, various ones of these I/O components may be integrated on the applications processor/multi-core processor 850 or may be located off the die or outside the package of the applications processor/multi-core processor 850.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
   a semiconductor chip memory array having resistive storage cells;
   a comparator to compare a first word to be written into the array against a second word stored in the array at a location targeted by a write operation that will write the first word into the array; and, circuitry to iteratively write to one or more bit locations where a difference exists between the first word and the second word with an increasing write current intensity with each successive iteration.

2. The apparatus of claim 1 further comprising a circuit to increase a write current amplitude with each successive iteration.

3. The apparatus of claim 2 further comprising write circuitry having a plurality of transistors to drive a bit line, where, with each successive iteration, a number of the transistors that is activated is increased.

4. The apparatus of claim 1 further comprising a circuit to increase an amount of time that a write current is applied with each successive iteration.

5. The apparatus of claim 3 wherein said circuit includes a counter to count clock cycles.

6. The apparatus of claim 1 further comprising a first circuit to increase a write current amplitude and a second circuit to increase an amount of time that a write current is applied where one or both of the write current amplitude and the amount of time that a write current is applied is increased with each successive iteration.

7. The apparatus of claim 6 wherein both the write current amplitude and the amount of time that the write current is applied is increased with each successive iteration.

8. An apparatus, comprising:
a semiconductor chip memory array having resistive storage cells;
a comparator to compare a first word to be written into the array against a second word stored in the array at a location targeted by a write operation that will write the first word into the array; and,
circuitry to iteratively write to one or more bit locations where a difference exists between the first word and the second word with increasing write current intensity with each successive iteration, where, an applied write current intensity for each successive iteration is based on a percentage of storage cells that is expected to be set by the applied write current intensity.

9. The apparatus of claim 8 further comprising a circuit to increase a write current amplitude with each successive iteration.

10. The apparatus of claim 9 further comprising write circuitry having a plurality of transistors to drive a bit line, where, with each successive iteration, a number of the transistors that is activated is increased.

11. The apparatus of claim 8 further comprising a circuit to increase an amount of time that a write current is applied with each successive iteration.

12. The apparatus of claim 11 wherein said circuit includes a counter to count clock cycles.

13. The apparatus of claim 8 further comprising a first circuit to increase a write current amplitude and a second circuit to increase an amount of time that a write current is applied where one or both of the write current amplitude and the amount of time that write current is applied is increased with each successive iteration.

14. The apparatus of claim 13 wherein both the write current amplitude and the amount of time that the write current is applied is increased with each successive iteration.

15. A computing system, comprising:
a plurality of processing cores; and,
a semiconductor chip memory having:
   i) a memory array having resistive storage cells;
   ii) a comparator to compare a first word to be written into the array against a second word stored in the array at a location targeted by a write operation that will write the first word into the array; and,
   iii) circuitry to iteratively write to one or more bit locations where a difference exists between the first word and the second word with an increasing write current intensity with each successive iteration.

16. The computing system of claim 15 further comprising a circuit to increase a write current amplitude with each successive iteration.

17. The computing system of claim 15 further comprising a circuit to increase an amount of time that a write current is applied with each successive iteration.

18. The computing system of claim 15 further comprising a first circuit to increase a write current amplitude and a second circuit to increase an amount of time that a write current is applied where one or both of the write current amplitude and an amount of time that the write current is applied is increased with each successive iteration.

19. The apparatus of claim 18 wherein both the write current amplitude and the amount of time that the write current is applied is increased with each successive iteration.

20. The apparatus of claim 15 wherein the resistive storage cells are magnetic storage cells.

* * * * *